(12) United States Patent
Aharon et al.

(10) Patent No.: US 9,012,254 B2
(45) Date of Patent: Apr. 21, 2015

(54) METHODS FOR FORMING A SEALED LIQUID METAL DROP

(75) Inventors: Oren Aharon, Rishon-LeZion (IL); Shai Feldman, Haifa (IL)

(73) Assignee: Kadoor Microelectronics Ltd, Haifa (IL)

(*) Notice: Subject to any disclaimer, the term of this patent is extended or adjusted under 35 U.S.C. 154(b) by 0 days.

(21) Appl. No.: 13/981,946

(22) PCT Filed: Jul. 31, 2012

(86) PCT No.: PCT/IB2012/053898
§ 371 (c)(1),
(2), (4) Date: Jul. 26, 2013

(87) PCT Pub. No.: WO2013/121253
PCT Pub. Date: Aug. 22, 2013

(65) Prior Publication Data
US 2014/0017842 A1    Jan. 16, 2014

Related U.S. Application Data

(60) Provisional application No. 61/633,625, filed on Feb. 15, 2012, provisional application No. 61/633,624, filed on Feb. 15, 2012, provisional application No. 61/685,113, filed on Mar. 12, 2012, provisional application No. 61/685,886, filed on Mar. 27, 2012.

(51) Int. Cl.
*H01L 21/00* (2006.01)
*B81C 1/00* (2006.01)
*H01H 29/00* (2006.01)

(52) U.S. Cl.
CPC ......... *B81C 1/00341* (2013.01); *B81C 1/00333* (2013.01); *H01H 29/00* (2013.01); *B81B 2201/018* (2013.01); *B81C 2203/0136* (2013.01); *B81C 2203/0145* (2013.01); *H01H 2029/008* (2013.01)

(58) Field of Classification Search
USPC ................. 347/50, 70, 154; 438/50
See application file for complete search history.

(56) References Cited

U.S. PATENT DOCUMENTS

| 4,264,798 A | 4/1981 | Graf |
| 6,373,356 B1 | 4/2002 | Gutierrez |
| 6,689,976 B1 | 2/2004 | Dove |

(Continued)

OTHER PUBLICATIONS

J. Simon, S. Saffer, C-J Kim, "A Liquid-Filled Microrelay with a Moving Mercury Microdrop", JMEMS, Sep. 1997, vol. 6, No. 3.
P. Shen, C-J Kim, "A Fast Liquid-Metal Droplet Switch Using EWOD", IEEE 2007.

(Continued)

*Primary Examiner* — Mark A Laurenzi
(74) *Attorney, Agent, or Firm* — Nathan & Associates Patent Agents; Menachem Nathan

(57) ABSTRACT

Methods for forming an enclosed liquid metal (LM) drop inside a sealed cavity by formation of LM components as solid LM component layers and reaction of the solid LM component layers to form the LM drop. In some embodiments, the cavity has boundaries defined by layers or features of a microelectronics (e.g. VLSI-CMOS) or MEMS technology. In such embodiments, the methods comprise implementing an initial microelectronics or MEMS process to form the layers or features and the cavity, sequential or side by side formation of solid LM component layers in the cavity, sealing of the cavity to provide a closed space and reaction of the solid LM components to form a LM alloy in the general shape of a drop. In some embodiments, nanometric reaction barriers may be inserted between the solid LM component layers to lower the LM eutectic formation temperature.

21 Claims, 10 Drawing Sheets

(56) References Cited

U.S. PATENT DOCUMENTS

| | | |
|---|---|---|
| 6,762,378 B1 | 7/2004 | Wong |
| 6,777,630 B1 | 8/2004 | Dove |
| 7,030,328 B1 | 4/2006 | Beerling |
| 7,132,614 B2 | 11/2006 | Beerling |
| 7,164,090 B2 | 1/2007 | Beerling |
| 7,234,233 B2 | 6/2007 | Fong |
| 7,358,452 B2 | 4/2008 | Beerling |
| 2005/0077160 A1 | 4/2005 | Watanabe |
| 2006/0017532 A1 | 1/2006 | Trutna |
| 2006/0108209 A1 | 5/2006 | Beerling |
| 2006/0227494 A1 | 10/2006 | Beerling |
| 2007/0195256 A1* | 8/2007 | Lee et al. ............... 349/153 |
| 2009/0243772 A1 | 10/2009 | Bilhaut |
| 2010/0025207 A1 | 2/2010 | Sen |

OTHER PUBLICATIONS

L. Latorre, J. Kim, J. Lee, P.P. De Guzman, H.J. Lee, P. Nouet, C-J Kim, "Electrostatic Actuation of Microscale Liquid-Metal Droplets", JMEMS, Aug. 2002, vol. 11, No. 4.

W. Shen, R. T. Edwards, C-J Kim, "Electrostatically Actuated Metal-Droplet Microswitches Integrated on CMOS Chip", JMEMS, Aug. 2006, vol. 15, No. 4.

C-H Chen, J-Whalen, D. Peroulis, "Liquid RF MEMS Wideband Reflective and Absorptive Switches", JMEMS, Dec. 2007, vol. 55, No. 12.

C-H Chen, J-Whalen, D. Peroulis, "Non Toxic liquid Metal 2-100 GHz, MEMS switch", IEEE, 2007.

P. Shen, C-J Kim, "A Fast Liquid-Metal Droplet Microswitch Using EWOD-Driven Contact-Line Sliding", JMEMS, Feb. 2009, vol. 18, No. 1.

* cited by examiner

1

METHODS FOR FORMING A SEALED LIQUID METAL DROP

CROSS REFERENCE TO RELATED APPLICATIONS

This application is related to and hereby claims the priority benefit of commonly-owned and U.S. provisional patent applications No. 61/633,624 filed Feb. 15, 2012, 61/633,625 filed Feb. 15, 2012, 61/685,113 filed Mar. 12, 2012 and 61/685,886 filed Mar. 27, 2012, all of which are incorporated herein by reference in their entirety

FIELD

Embodiments disclosed herein relate in general to methods for forming miniaturized liquid metal (LM) drops in sealed cavities.

BACKGROUND

The use of liquid metals in various electrical or electromechanical devices is known. Larger devices using liquid metals include relays (e.g. mercury relays) and switches. Small LM drops are also known for their use in micro-electro-mechanical system (MEMS) devices, for example for RF and other switching and cooling devices. Such small LM drops are inserted (i.e. "injected") into the respective devices in liquid form. The incorporation of LM components into microelectronic or MEMS devices would benefit from use of processes and tools already in use in these technologies, for example various thin film formation technologies and tools. Microelectronics and MEMS thin film formation (e.g. by deposition) results in solid films. There is therefore a need for, and it would be advantageous to have methods for forming small and even ultra-small (on the scale of microelectronic devices) LM drops which are compatible with known microelectronics and MEMS technologies.

SUMMARY

In various embodiments, there are provided methods for forming a liquid metal (LM) drop enclosed and sealed inside a small cavity. The LM drop is liquid at room temperature or under normal use conditions. The term "drop" is not meant to be limiting to a particular shape or size. In some embodiments, the drop may have a volume on the order of tens of cubic micrometer. In other embodiments, the drop volume may be on the order of hundreds or thousands of cubic micrometers. In yet other embodiment, the drop volume may be up to a few millions of cubic micrometers. The drop may be enclosed and sealed in a cavity of slightly larger volume (referred to herein as "sealed cavity" or "sealed volume"). In some embodiments where the drop has such a miniaturized volume, the cavity sealing it may be formed in a microelectronic or a micro-electromechanical system (MEMS) device (including glass based MEMS) or in a microelectronics based interposer for 2.5D and/or 3D multiple IC integration.

The sealed cavity may then have boundaries defined by layers or features of a microelectronics process or technology (such as VLSI-CMOS) or of a MEMS technology. "CMOS" is used henceforth as an exemplary (but in no way limiting) term for the process or technology, to simplify the description. In other embodiments, a sealed cavity may be formed by covering and sealing a LM drop formed on a flat surface.

In an embodiment, the method comprises implementing an initial CMOS process to form CMOS layers or features, sequential formation (e.g. by deposition) of LM component materials as solid phase films or layers in an appropriate cavity formed in the CMOS layers, sealing of the cavity to provide a closed space, and reaction of the solid LM components to form the LM alloy in the general shape of a drop.

In an embodiment there is provided a method for forming a LM drop sealed in a cavity comprising the steps of providing a substrate having a cavity formed therein, forming a stack of a plurality of solid LM component layers in the cavity, sealing the cavity to form a sealed volume and reacting the solid LM component layers to form a sealed LM drop.

In an embodiment, the solid LM component layers are formed sequentially.

In an embodiment, the solid LM component layers are formed side by side.

In an embodiment there is provided a method for forming a LM drop sealed in a cavity comprising the steps of providing a substrate having a cavity formed therein, forming a plurality of solid LM component layers in the cavity, sealing the cavity partially to form a partially sealed volume, reacting the solid LM component layers to form a sealed liquid metal drop; and sealing the cavity to form a fully sealed volume.

In an embodiment there is provided a method for forming a LM drop sealed in a cavity comprising the steps of providing a substrate, forming plurality of solid LM component layers in defined areas of the substrate, sealing the defined areas to form a sealed volume, and reacting the solid LM component layers to a sealed liquid metal drop.

In an embodiment, the step of sealing the cavity includes forming an inert layer which seals the cavity.

In some embodiments, the substrate includes a microelectronic layered structure and cavity is formed partially inside the layered structure.

In some embodiments, the substrate includes a microelectronic layered structure and cavity is formed fully inside the layered structure.

In some embodiments, the microelectronic layered structure includes CMOS layers.

In some embodiments, a wetting agent may be applied to cavity surfaces to affect the wetting angle and therefore contact properties of the LM drop.

In some embodiments, a nanometric thickness reaction barrier may be added between two solid LM components to increase the liquefaction temperature beyond the nominal eutectic temperature of the components.

In some embodiments, the cavity may be under vacuum or filled with an inert gas.

Exemplary materials which can be formed as solid layers and reacted to form a LM include (but are not limited to) Gallium (Ga), Indium (In) and Tin (Sn). Various additives such as Copper (Cu), Silver (Ag) and Bismuth (Bi) see e.g. U.S. Pat. No. 5,478,978 may be added to reduce the liquefaction temperature of alloys formed therebetween and/or to reduce the oxidation rate of the alloy.

BRIEF DESCRIPTION OF THE DRAWINGS

Non-limiting embodiments are herein described, by way of example only, with reference to the accompanying drawings, wherein.

DETAILED DESCRIPTION

Figure 1A:
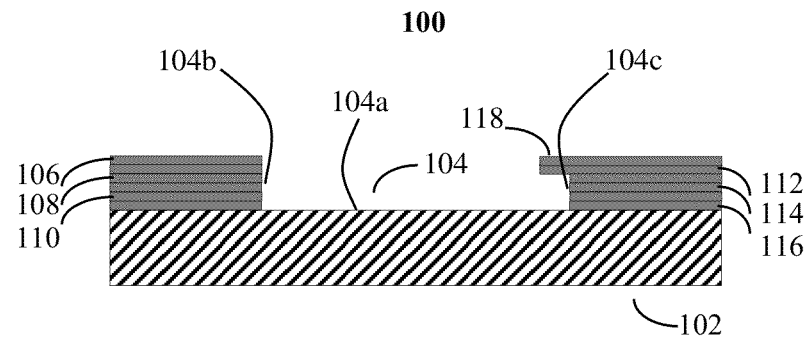
FIG. 1 show in cross section an embodiment of a microelectronics device layered structure with a cavity formed therein: (A) covered with photo-resist; (B) with a first solid LM component layer formed inside the cavity; (C) with a second solid LM component layer formed inside the cavity; (D) with a third solid LM component layer formed inside the cavity; (E) with a first inert layer covering the cavity; (F) after a lift-off process which removes all layers thereupon except in the cavity area; (G) with a second inert layer covering the entire wafer and sealing the cavity; and (I) after liquefaction of the LM metal components to form a LM drop inside the sealed cavity.

FIGS. 1A-1I show schematically, in cross section, a wafer with a cavity at various process stages in an embodiment of a method for forming a LM drop in a sealed cavity disclosed herein. FIG. 2 shows a flow chart listing the different process steps. The following description uses exemplarily a cross section of a microelectronics device structure formed using VLSI/CMOS technology, and In, Ga and Sn as exemplary LM components. Other embodiments may use device structures formed using other technologies and/or substrates such as GaAs, GaN, SiGe, Silicon on Insulator (SOI) or glass. The liquefaction temperatures of the three metals are 30 C (Ga), 156 C (In) and 231 C (Sn). The eutectic temperatures are 120 C for In—Sn, 20 C for Ga—Sn, 15 C for Ga—In and −19 C for a Ga—In—Sn alloy with minute amounts of additives, see below.

A microelectronics wafer is prepared with an open cavity. FIG. 1A is a cross section of a microelectronics device layered structure 100 on a wafer 102 with an open cavity 104. The cavity depth is typically a few micrometers ("microns"). Layered structure 100 includes pre-processed metallic layers (e.g. layers 106, 108 and 110) and non-metallic layers (e.g. layers 112, 114 and 116). Cavity 104 is defined by a bottom plane 104a, side planes 104b, 104c (each number referring to one side "wall" and one back or front wall of the cavity when looking at the cross section) and a top plane 134d (FIG. 1I) Note that the cavity need not have a rectangular cross section, and may have other cross section shapes. In an embodiment, cavity 104 is formed partially inside the layered structure. In other embodiments, for example as in structure 100, the cavity may be formed entirely inside the layered structure, with cavity side planes 104b, 104c bound by CMOS metallic layers 106-110 and CMOS dielectric layers 112-116.

Figure 1B:
Figure 1C:
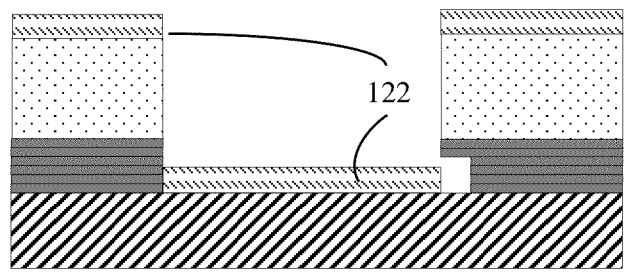
Figure 1D:
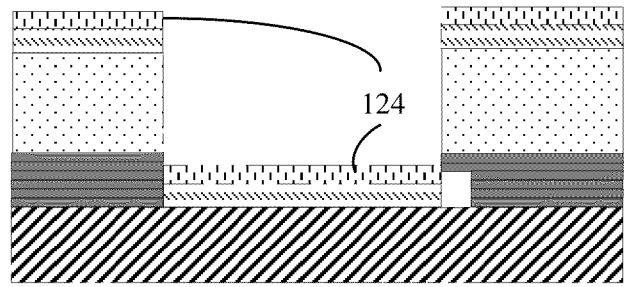
Figure 1E:
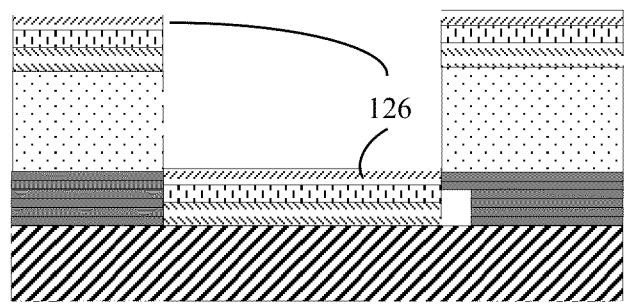
Figure 2:
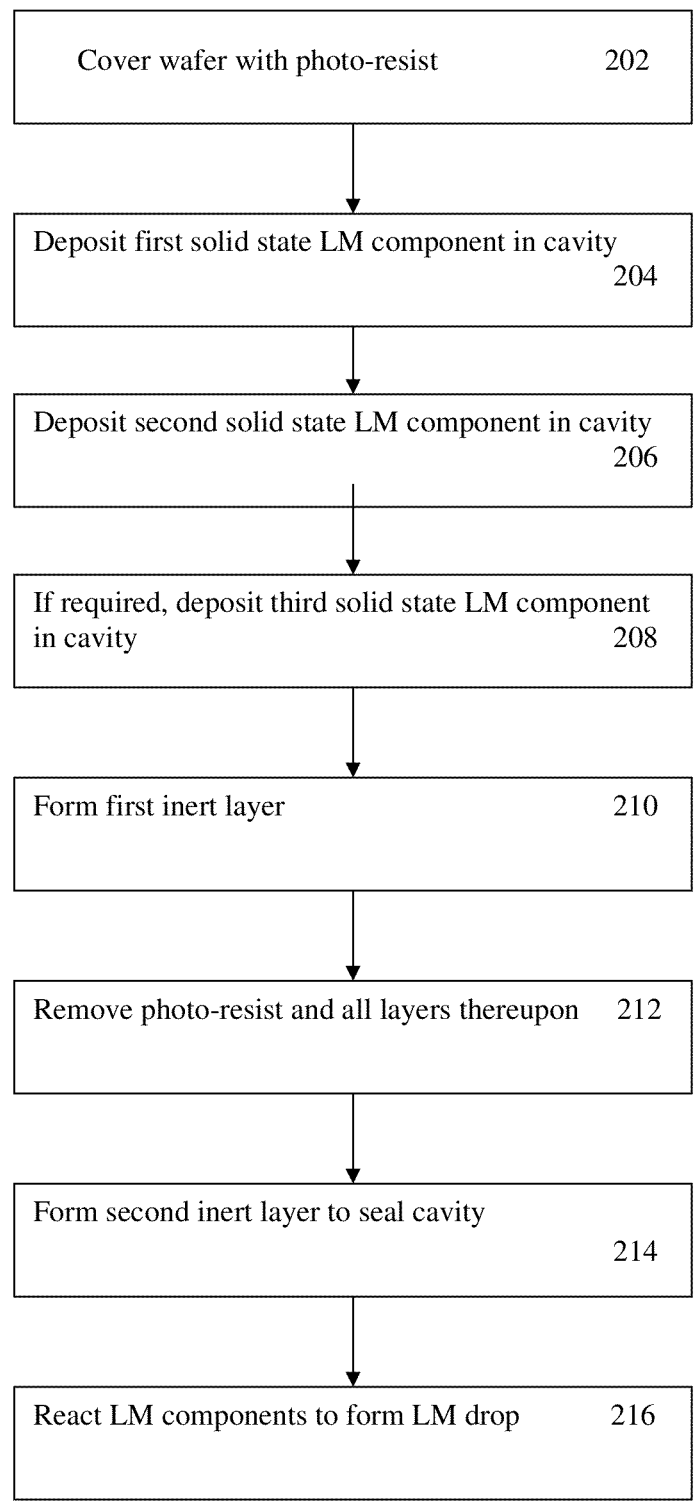
FIG. 2 shows a flow chart describing schematically steps in a first method embodiment disclosed herein.

In step 202, the wafer is covered with a photo-resist (PR) layer 120 which, after patterning, masks all areas except the cavity and its close surroundings (FIG. 1B). In step 204, a first LM component layer 122 (e.g. Ga) is formed in solid phase to a predetermined thickness, volume or weight on the wafer (FIG. 1C). "Formation" is henceforth used as a generic term for the physical deposition, chemical deposition, vapor deposition or electro-deposition of a solid LM component or of an insulating layer. The wafer is appropriately cooled so that the Ga formed inside the cavity forms a solid layer. Since the liquefaction temperature of Ga is 30 C, the formation can be performed advantageously at a temperature just below 30 C, for example 29 C. This removes the need to cool the substrate to a lower temperature. In step 206, a second LM component layer 124 (e.g. In) is formed in solid phase to a predetermined thickness over the first layer (FIG. 1D). The second layer can be formed at the highest temperature below a liquefaction temperature of the alloy formed by the first and second layers. Exemplarily for Ga—In, the liquefaction temperature is 15 C. Note that if the alloy Ga—In were to be formed as one solid material (in one step), its formation would require a temperature lower than 15 C in order to keep it solid on the wafer. Optionally, in step 208, a third LM component 126 (e.g. Sn) is formed in solid phase to a predetermined thickness over the second layer (FIG. 1E). As with the first two layers, the separate formation of the Sn can be advantageously performed at the highest temperature below the liquefaction temperature of the alloy formed by the first and second, in this case 15 C.

Figure 1F:
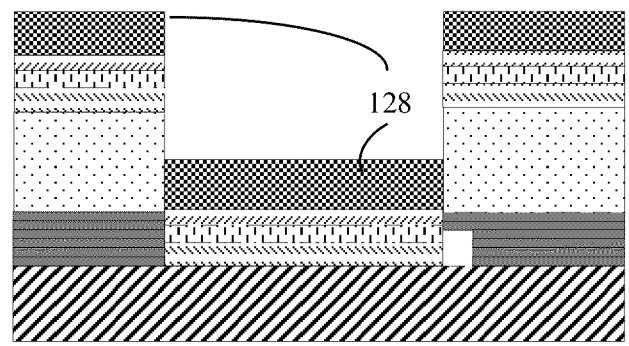
Figure 1G:
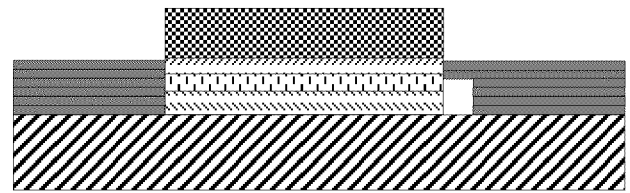
Figure 1H:
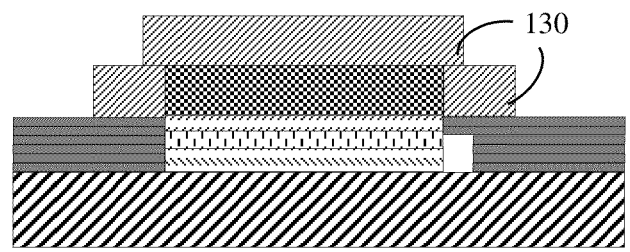
Figure 1I:
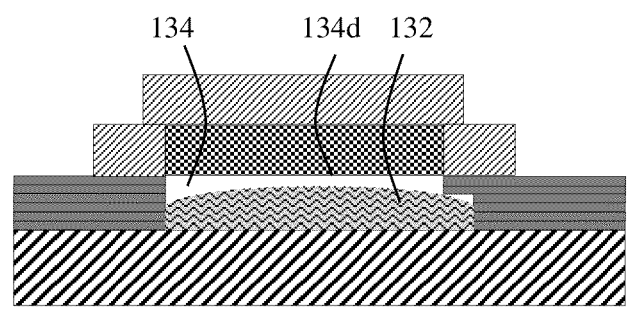
Figure 3A:
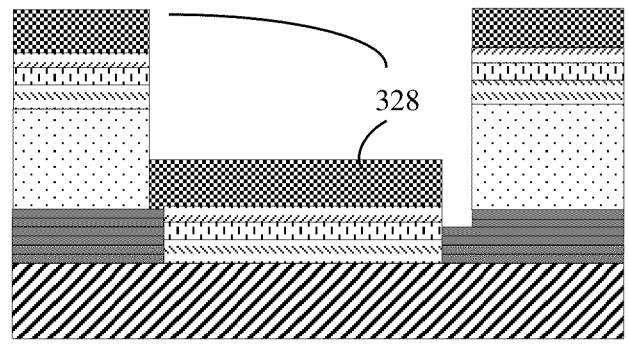
FIG. 3 show in cross section another embodiment of a microelectronics device layered structure with a cavity formed therein: (A) covered with photo-resist; (B) after a lift-off process which removes all layers thereupon except in the cavity area; (C) after liquefaction of the LM components; and (D) with a second inert layer covering the entire wafer and sealing the cavity.
Figure 3B:
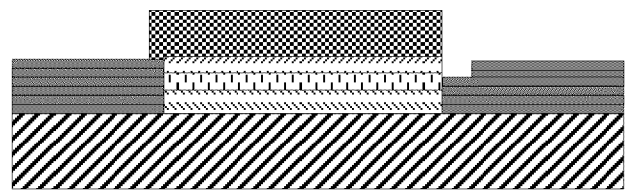
Figure 3C:
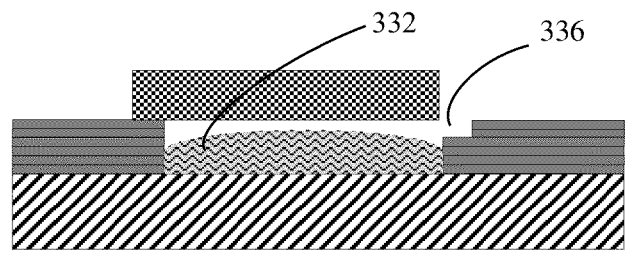
Figure 3D:
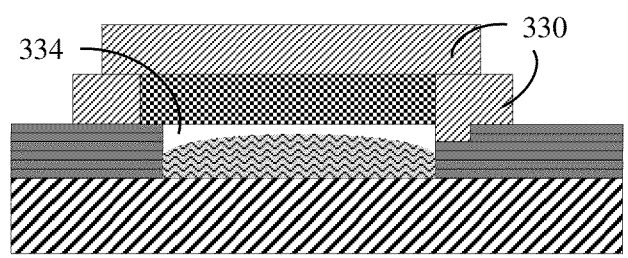

Exemplarily, predetermined thicknesses (or volume or mass) of the Ga, In and Sn layers may be chosen such that they provide a weight LM component ratio of 68.5% Ga, 21.5% In and 10% Sn. Optionally, low amounts of additives such as Cu, Au or Bi may be added to lower the LM solidification temperature of the complete drop. These can be added by deposition from additional targets (or electroplating sources) or as part of the In or Sn deposition targets or sources. The three layers thickness could be designed to fill the cavity in height. In step 210, a first inert layer 128 of a material such as spin-on-glass (SOG), silicon nitride (SiN), polysilicon, atomic layer deposited (ALD) titanium-oxide or molecular vapor deposited (MVD) alumina is formed over the wafer (FIG. 1F). In an embodiment, this layer covers the entire wafer. Alternatively, in another embodiment shown in FIG. 3A, the inert layer does not cover the entire cavity. In step 212, a lift-off process removes PR layer 120 and all layers formed thereon, leaving a cavity covered with first inert layer 128 and with solid LM component layers there within (FIG. 1G and FIG. 3B). In the case where the inert layer does not cover the entire cavity, a passage 336 is created between the outside environment and the inner side of the future cavity, FIG. 3C. For the embodiment in FIG. 1, in step 214, a second inert layer 130 is formed over the entire wafer, covering the first inert layer and sealing the cavity (FIG. 1H). In step 216, the wafer is brought to room temperature or slightly above it. Various additives such as Cu, Ag and Bi, see e.g. U.S. Pat. No. 5,478, 978 may be added to reduce the liquefaction temperature of alloys formed therebetween and/or to reduce the oxidation rate of the alloy. The solid Ga, In and Sn layers undergo a melting and alloying transformation to form a liquid metal "drop" with an eutectic temperature of about −19° C. The LM drop 132 is shown encapsulated in the sealed cavity 134 in FIG. 1I. For the embodiment in FIG. 3, the solid LM components undergo liquefaction after step 212 (FIG. 3C), and the second inert layer is formed as in step 214 to seal the cavity (FIG. 3D).

In an embodiment, LM drop 132 has a volume smaller that the cavity volume and is mobile within the cavity. In an embodiment, the cavity may be filled with an inert gas. In an embodiment, the cavity may be evacuated (under vacuum). The formation of each layer above may be achieved using processes known in the art. For example, the Ga may be evaporated or sputtered in a vacuum chamber using for example a process described in Morley et al., J. Vac. Sci. Technol. A, 26 (4), pp. 581-586, 2008. Alternatively, the Ga may be electroplated from an appropriate solution over a metal electrode layer (e.g. W) previously formed inside the cavity, using exemplarily a process described in Kim et al., J. Mater. Res, 26 (18), 2011. The In layer may be evaporated or sputtered using a process described in Bae et al., J. Phys. Chem. B, 109 (7), pp. 2526-31, 2005. Alternatively, the In may be electroplated from an appropriate bath over one of the other LM layers (e.g. Ga) which serves as electrode, using exemplarily a process described in Tian et al, IEEE Electronic Components and Technology Conference, ECTC 2008. 27-30 May, 2008. The Sn layer may be evaporated or sputtered using exemplarily a process described in U.S. Pat. No. 5,776,790. Alternatively, the Sn layer may be electroplated from an appropriate solution over the first LM layer which serves as electrode, using exemplarily a process described in U.S. Pat. No. 4,027,055.

In the solid LM component layer formation steps above, care is taken to prevent oxidation of each component. Evaporation and sputtering processed performed in vacuum are advantageous in that they create very low oxidation levels for the LM components. In some embodiments using deposition (e.g. evaporation or sputtering) processes, all LM components may be formed using a single tool while keeping the process under vacuum. In embodiments using electroplating or a combination of electroplating and deposition (evaporation or sputtering), oxidized surfaces may be treated (e.g. by acid etch or ion sputtering) to remove surface oxides between LM component formations. Electroplating is advantageous in that it can form a solid layer inside a cavity which has an overhang, such as overhang 118 in FIG. 1A. Another of its advantages is the ability to use the electroplated metals as the base for the next layer of electroplated metal.

The formation order of the LM components can be used advantageously to reduce the total oxidization of the liquid metal. Formation of Ga first, followed by either In or Sn, may reduce the total oxidation especially if the formation of the insulating layer is done in a different tool than the LM components tool, when the wafer is shifted between these tools exposed to the atmosphere. However, the order of the formation of the solid LM component layers may be changed from the one described above. For example, if all three components (Ga, In and Sn) are electroplated, then the order may be reversed so that Ga is first, Sn is second and In is third. In an exemplary process, the three layers are electroplated with a weight ratio of about 68% Ga, 21% In and 10% Sn, with 1% left for additional metals (additives). Exemplarily, the additional metals may be silver or copper in low amounts, and these may be also added by additional electroplating processes.

Figure 4A:
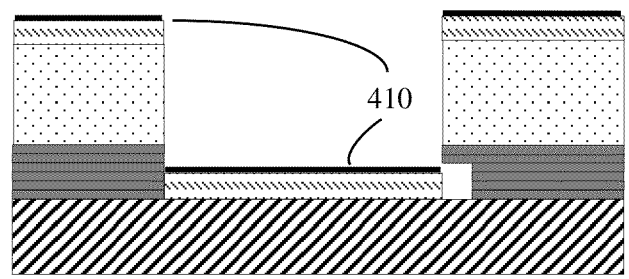
FIG. 4 show in cross section another embodiment of a microelectronics device layered structure with a cavity formed therein: (A) with a first reaction barrier layer on top of a first solid LM component layer; (B) with a second reaction barrier layer on top of a second solid LM component layer; and (C) with a third solid LM component layer on top of the second reaction barrier layer of FIG. 3B.
Figure 4B:
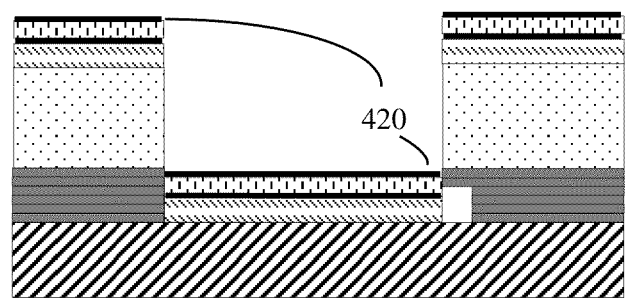
Figure 4C:
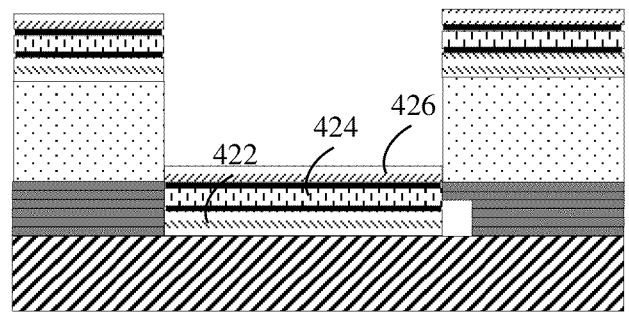
Figure 5A:
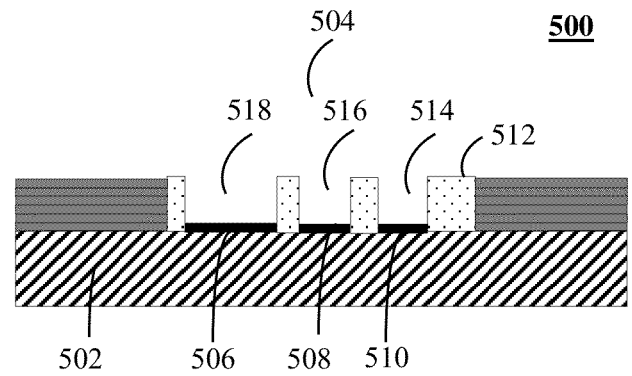
FIG. 5 show in cross section yet another embodiment of a microelectronics device layered structure with a cavity formed therein: (A) with three side-by-side electrodes on a first sacrificial layer inside the cavity; (B) with a first solid LM component layer formed on one electrode inside the cavity; (C) with a second solid LM component layer formed on a second electrode inside the cavity; (D) with a third solid LM component layer formed on a third electrode inside the cavity; (E) with a second sacrificial layer formed over the cavity; (F) with a first inert layer formed and patterned over the wafer; (G) with the first and second sacrificial layers removed; and (H) after formation of a second inert layer to seal the cavity; and (I) after liquefaction of the LM metal components to form a LM drop inside the sealed cavity.
Figure 5B:
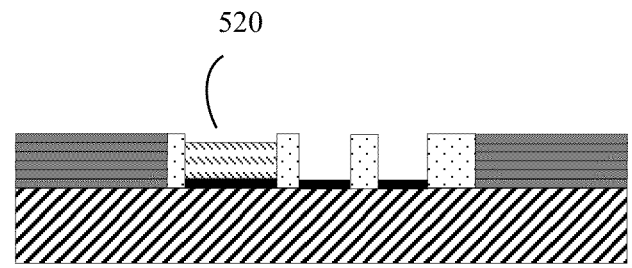
Figure 5C:
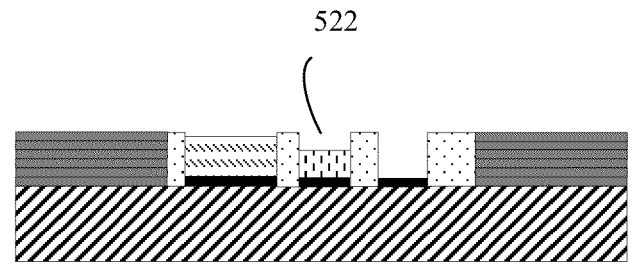
Figure 5D:
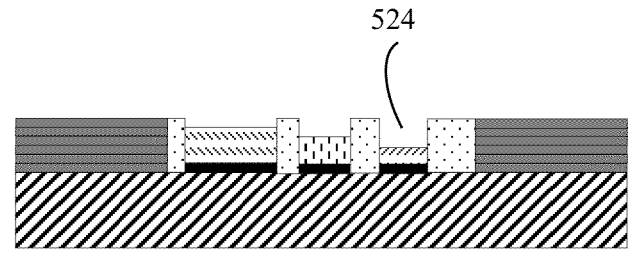
Figure 5E:
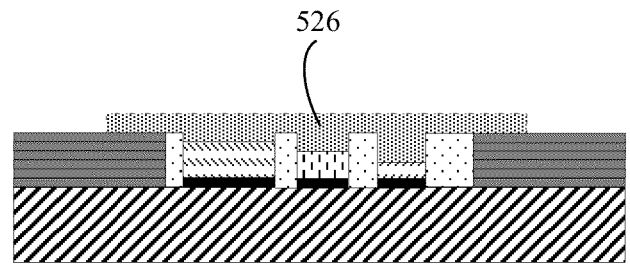
Figure 5F:
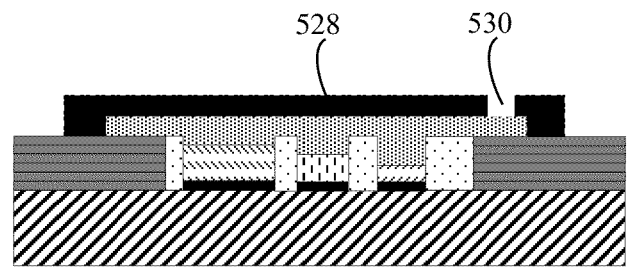
Figure 5G:
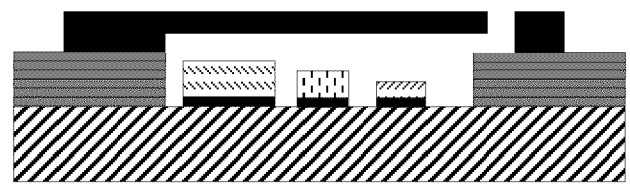
Figure 5H:
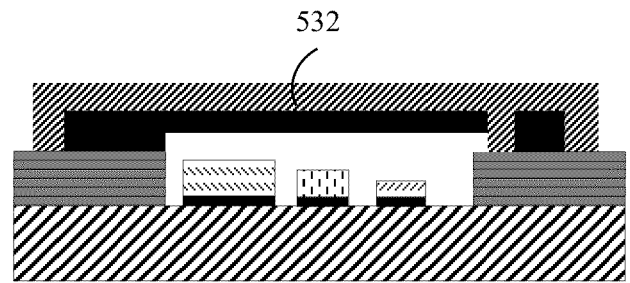
Figure 5I:
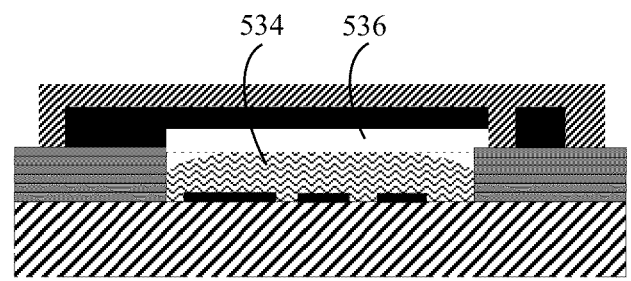

In an embodiment, the formations may be performed even closer to 30 C by adding a (or a few) nanometer-thick layer which acts as a reaction barrier between the LM components and therefore prevents the LM components from reacting at nominal eutectic temperatures. The addition of such reaction barriers is illustrated schematically in FIGS. 4A-4C. In these figures, 410 and 420 indicate respectively a first and a second nanometric reaction barrier layer inserted between solid LM components 422, 424 and 426 (which parallel layers 122, 124 and 126 in FIG. 1). Materials serving as nanometric reaction barriers may exemplarily be metals such as Ta or W which have high eutectic temperatures when in contact with the LM components. Alternatively, the reaction barrier materials may be ceramics such as $Al_2O_3$ or $Ta_2O_5$. The reaction barriers may be formed using processes compatible with those used to form the solid LM component layers.

In an embodiment of the method shown in FIG. 5, the solid LM components may be formed (e.g. electroplated) not on top of each other inside a cavity but side by side. As in FIG. 1, the process starts with a microelectronics wafer being prepared with an open cavity. FIG. 5A is a cross section of a microelectronics device layered structure 500 on a wafer 502 with a cavity 504. The microelectronics layers may be as in FIG. 1 and are not shown or described in detail except where needed. The cavity includes three electrodes (e.g. made of tungsten) 506, 508 and 510 which are separated by sections of a first sacrificial layer 512 (e.g. $SiO_2$), creating 3 sub-cavities 514, 516 and 518. The electrodes shape and area may differ in the different sub-cavities. Following a process similar to that described with reference to FIG. 2, a first LM component layer 520 (e.g. Ga) is formed or electroplated in solid phase to a predetermined thickness, volume or weight on first electrode 506 (FIG. 5B). Then, a second LM component layer 522 (e.g. In) is formed or electroplated in solid phase to a predetermined thickness over second electrode 508 (FIG. 5C). Then, a third LM component 524 (e.g. Sn) is formed in solid phase to a predetermined thickness over the third electrode 510 (FIG. 5D). A second sacrificial layer 526 (e.g. $SiO_2$) is added and patterned (FIG. 5E). Then, a first inert layer 528 is formed and patterned over the wafer (FIG. 5F). Sacrificial layers 512 and 526 are then removed (e.g. by chemical etch) through openings 530 in the inert layer, leaving the cavity covered with first inert layer 528 and with solid LM component layers there within (FIG. 5G). A second inert layer 532 is formed over the entire wafer, covering the first inert layer and sealing the cavity (FIG. 5H). The wafer is then brought to room temperature or slightly above it to liquefy the LM component layers into a LM drop 534 shown encapsulated in a sealed cavity 536 in FIG. 5I.

Figure 6A:
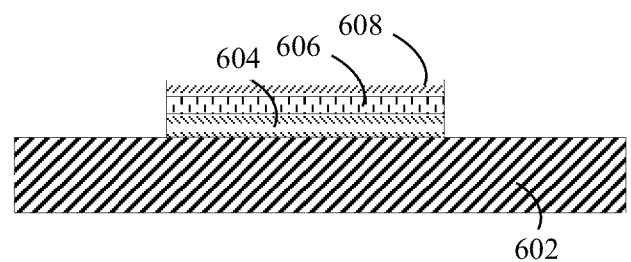
FIG. 6 show in cross section an embodiment of a substrate (A) with LM layered components; (B) with an inert layer covering the LM layered components; and (C) after liquefaction of the LM metal components to form a LM drop inside the sealed cavity.
Figure 6B:
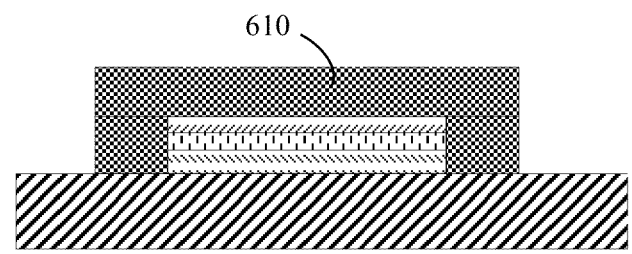
Figure 6C:
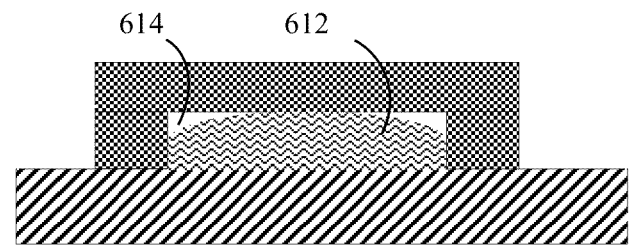

In an embodiment of the method shown in FIG. 6, the solid LM components 602, 604, 606 (FIG. 6A) may be formed sequentially not inside a cavity but above the surface of a flat substrate, using a process known in the art or as described above. Then, an inert layer 610 is formed and patterned over the substrate and over the LM layered components (FIG. 6B), using a process known in the art or as described above in FIG. 1. The wafer is then brought to room temperature or slightly above it to liquefy the LM component layers into a LM drop 612 shown encapsulated in a sealed cavity 614 in FIG. 6C.

In various embodiments, prior to the formation of LM component layers, the surfaces of the substrate and the cavity may be covered with "wetting" materials that modify the surface energy (not shown). Such materials may include Self Assembled Monolayers (SAM) of Alkoxy-silanes, Chloro-silanes, Fluoro-silanes, 11-hydroxy-1-undecanethiol or poly (dimethyl siloxane). The application process of such materials is well known. The addition of wetting materials allows control of the wetting angle of the LM drop with all surrounding surfaces and therefore controls the shape and location of the final LM drop inside the sealed cavity.

Exemplary uses of a LM drop sealed in a cavity formed in a microelectronic layered structure may be found in co-pending PCT patent application PCT/IB2012/053899 by the same inventors.

All patents, patent applications and publications mentioned in this specification are herein incorporated in their entirety by reference into the specification, to the same extent as if each individual patent, patent application or publication was specifically and individually indicated to be incorporated herein by reference. In addition, citation or identification of any reference in this application shall not be construed as an admission that such reference is available as prior art.

While this disclosure describes a limited number of embodiments, it will be appreciated that many variations, modifications and other applications of such embodiments may be made. The disclosure is to be understood as not limited by the specific embodiments described herein, but only by the scope of the appended claims.

The invention claimed is:

1. A method for forming a liquid metal (LM) drop sealed in a cavity, comprising the steps of:
   a) providing a substrate having a cavity formed therein;
   b) forming a plurality of solid LM component layers in the cavity;
   c) sealing the cavity to form a sealed volume; and
   d) reacting the solid LM component layers to form a sealed LM drop.

2. The method of claim 1, wherein the step of forming includes forming sequentially a stack of the solid LM components.

3. The method of claim 1, wherein the step of forming includes forming the solid plurality of solid LM components side by side.

4. The method of claim 1, wherein the plurality of solid LM component layers of solid LM component layers includes three layers.

5. The method of claim 1, wherein the step of forming includes using a process selected from the group consisting of evaporation, sputtering and electroplating.

6. The method of claim 1, wherein the layers include layers of gallium (Ga), indium (In) and tin (Sn).

7. The method of claim 6, wherein the step of forming sequentially includes forming in sequence layers of Ga, In and Sn.

8. The method of claim 6, wherein the step of forming sequentially includes forming in sequence layers of Ga, Sn and In.

9. The method of claim 6, wherein the forming includes using a process selected from the group consisting of evaporation and sputtering for the Ga and In and electroplating for the Sn.

10. The method of claim 1, wherein the step of sealing the cavity includes forming an inert layer which seals the cavity.

11. The method of claim 10, wherein the inert layer includes a material selected from the group consisting of spin-on-glass, Silicon Nitride, polysilicon, titanium-oxide and alumina.

12. The method of claim 1, further comprising the step of forming a nanometric reaction barrier between two solid LM component layers.

13. The method of claim 12, wherein the reaction barrier is a metal or a ceramic material.

14. The method of claim 1, further comprising the step of, prior to the step of forming, applying a wetting substance which affects a wetting angle of the LM drop.

15. The method of claim 1, wherein the substrate includes a microelectronic layered structure and wherein the cavity is formed partially inside the layered structure.

16. The method of claim 1, wherein the substrate includes a microelectronic layered structure and wherein the cavity is formed fully inside the layered structure.

17. The method of claim 15, wherein the layered structure includes CMOS layers.

18. The method of claim 1, wherein the substrate is a MEMS wafer.

19. The method of claim 1, wherein the step of sealing includes filling the cavity with an inert gas.

20. The method of claim 1, wherein the step of sealing includes evacuating the cavity to form as vacuum therein.

21. The method of claim 15, wherein the layered structure includes interposer layers for multiple IC integration.

* * * * *